United States Patent
Patel et al.

(10) Patent No.: US 9,660,212 B2
(45) Date of Patent: May 23, 2017

(54) OPTICAL DEVICE COMPRISING A CHARGE TRANSPORT LAYER OF INSOLUBLE ORGANIC MATERIAL AND METHOD FOR THE PRODUCTION THEREOF

(71) Applicant: CAMBRIDGE DISPLAY TECHNOLOGY LIMITED, Cambridgeshire (GB)

(72) Inventors: Nalinkumar Lallubhai Patel, Cambridge (GB); Natasha M. Conway, Histon (GB); Mark Leadbeater, Depden (GB); Ilaria Grizzi, Cambridge (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 0 days.

(21) Appl. No.: 14/642,663

(22) Filed: Mar. 9, 2015

(65) Prior Publication Data
US 2015/0188069 A1    Jul. 2, 2015

Related U.S. Application Data

(63) Continuation of application No. 10/583,677, filed as application No. PCT/GB2004/005392 on Dec. 20, 2004, now Pat. No. 8,974,917.

(30) Foreign Application Priority Data

Dec. 19, 2003 (GB) .................. GB329364.4

(51) Int. Cl.
| | | |
|---|---|---|
| H01L 51/54 | (2006.01) | |
| H01L 51/50 | (2006.01) | |
| H01L 51/00 | (2006.01) | |
| H01L 51/56 | (2006.01) | |
| H01L 51/52 | (2006.01) | |

(52) U.S. Cl.
CPC ........ *H01L 51/506* (2013.01); *H01L 51/0003* (2013.01); *H01L 51/0043* (2013.01); *H01L 51/5016* (2013.01); *H01L 51/5028* (2013.01); *H01L 51/5088* (2013.01); *H01L 51/5096* (2013.01); *H01L 51/5206* (2013.01); *H01L 51/5221* (2013.01); *H01L 51/56* (2013.01); *H01L 51/0037* (2013.01); *H01L 51/0039* (2013.01); *H01L 51/0059* (2013.01); *H01L 51/0062* (2013.01); *H01L 51/0072* (2013.01); *H01L 51/0084* (2013.01); *H01L 51/0085* (2013.01); *H01L 51/5048* (2013.01); *Y10S 428/917* (2013.01)

(58) Field of Classification Search
CPC ............. H01L 51/0032; H01L 51/0003; H01L 51/0034; H01L 51/0035; H01L 51/0043; H01L 51/0039; H01L 51/005; H01L 51/0051; H01L 51/0037; H01L 51/0052; H01L 51/0053; H01L 51/0059; H01L 51/0062; H01L 51/0071; H01L 51/00; H01L 51/72; H01L 51/0073; H01L 51/0074; H01L 51/0084; H01L 51/0085; H01L 51/50; H01L 51/5012; H01L 51/5016; H01L 51/5056; H01L 51/5028; H01L 51/5048; H01L 51/5088; H01L 51/5096; H01L 51/5206; H01L 51/5221; H01L 51/506; H01L 51/56; H01L 2251/00; H01L 2251/10; C08G 61/00; C08G 61/12; Y10S 428/917
USPC ......... 428/690, 917, 411.4, 336; 427/58, 66; 313/502–509; 257/40, 88–104, 257/E51.001–E51.052; 252/301.16–301.35
See application file for complete search history.

(56) References Cited

U.S. PATENT DOCUMENTS

| | | | |
|---|---|---|---|
| 4,539,507 A | 9/1985 | VanSlyke et al. | |
| 5,061,569 A | 10/1991 | VanSlyke et al. | |
| 5,518,824 A | 5/1996 | Funhoff et al. | |
| 5,523,555 A | 6/1996 | Friend et al. | |

(Continued)

FOREIGN PATENT DOCUMENTS

| | | |
|---|---|---|
| DE | 100 59 810 | 6/2002 |
| EP | 0 707 020 | 4/1996 |

(Continued)

OTHER PUBLICATIONS

Baldo et al., "Highly Efficient Phosphorescent Emission From Organic Electroluminescent Devices," Nature, vol. 395, pp. 151-154 (1998).

(Continued)

*Primary Examiner* — Andrew K Bohaty
(74) *Attorney, Agent, or Firm* — Marshall, Gerstein & Borun LLP

(57) ABSTRACT

A method of forming an organic light emitting diode comprising the steps of: providing a substrate comprising a first electrode for injection of charge carriers of a first type; forming a charge transporting layer by depositing over the substrate a charge transporting material for transporting charge carriers of the first type, the charge transporting material being soluble in a solvent; treating the charge transporting layer to render it insoluble in the solvent; forming an electroluminescent layer by depositing onto the charge transporting layer a composition comprising the solvent, a phosphorescent material, and a host material; and depositing over the electroluminescent layer a second electrode for injection of charge carriers of a second type.

11 Claims, 1 Drawing Sheet

(56) References Cited

U.S. PATENT DOCUMENTS

| | | | |
|---|---|---|---|
| 5,554,450 A | 9/1996 | Shi et al. |
| 5,798,170 A | 8/1998 | Zhang et al. |
| 5,853,905 A | 12/1998 | So et al. |
| 5,909,038 A | 6/1999 | Hwang et al. |
| 6,074,734 A | 6/2000 | Kawamura et al. |
| 6,107,452 A | 8/2000 | Miller et al. |
| 6,127,693 A | 10/2000 | Chen et al. |
| 6,268,695 B1 | 7/2001 | Affinito |
| 6,309,763 B1 | 10/2001 | Woo et al. |
| 6,372,154 B1 | 4/2002 | Li |
| 6,630,566 B1 | 10/2003 | Allen et al. |
| 6,858,703 B2 | 2/2005 | Allen et al. |
| 6,953,628 B2 | 10/2005 | Kamatani et al. |
| 7,030,138 B2 | 4/2006 | Fujimoto et al. |
| 7,125,998 B2 | 10/2006 | Stossel et al. |
| 7,345,141 B2 | 3/2008 | Mizusaki et al. |
| 2002/0031602 A1 | 3/2002 | Zhang |
| 2002/0067124 A1 | 6/2002 | Kafafi et al. |
| 2002/0096995 A1 | 7/2002 | Mishima et al. |
| 2002/0117662 A1 | 8/2002 | Nii |
| 2002/0125818 A1 | 9/2002 | Sato et al. |
| 2002/0182441 A1 | 12/2002 | Lamansky et al. |
| 2002/0185635 A1 | 12/2002 | Doi et al. |
| 2003/0035978 A1 | 2/2003 | Raychaudhuri et al. |
| 2003/0068526 A1 | 4/2003 | Kamatani et al. |
| 2003/0082402 A1 | 5/2003 | Zheng et al. |
| 2003/0091862 A1 | 5/2003 | Tokito et al. |
| 2003/0096138 A1 | 5/2003 | Lecloux et al. |
| 2004/0101618 A1 | 5/2004 | Ottermann et al. |
| 2006/0257684 A1 | 11/2006 | Arakane et al. |

FOREIGN PATENT DOCUMENTS

| | | |
|---|---|---|
| EP | 0851714 | 7/1998 |
| EP | 0 880 303 | 11/1998 |
| EP | 0 901 176 A2 | 3/1999 |
| EP | 0 947 123 A1 | 10/1999 |
| EP | 0 949 850 A1 | 10/1999 |
| EP | 0 953 624 A1 | 11/1999 |
| EP | 1 011 154 A1 | 6/2000 |
| EP | 1 231 252 A2 | 8/2002 |
| EP | 1 245 659 | 10/2002 |
| GB | 2 348 316 A | 9/2000 |
| JP | 2000260560 A | 9/2000 |
| JP | 2001323137 A | 11/2001 |
| JP | 2001527102 A | 12/2001 |
| JP | 2002-050482 | 2/2002 |
| JP | 2002100476 A | 4/2002 |
| JP | 2002134277 A | 5/2002 |
| JP | 2002208481 A | 7/2002 |
| JP | 2002-324679 A | 11/2002 |
| JP | 2003-077673 | 3/2003 |
| JP | 2003163086 A | 6/2003 |
| JP | 2003217863 A | 7/2003 |
| JP | 2003221447 A | 8/2003 |
| JP | 2003/257676 A | 9/2003 |
| JP | 2003264086 A | 9/2003 |
| JP | 2003317946 A | 11/2003 |
| WO | WO-90/13148 A1 | 11/1990 |
| WO | WO-96/16449 | 5/1996 |
| WO | WO-96/20253 A1 | 7/1996 |
| WO | WO-98/10621 | 3/1998 |
| WO | WO-99/54385 A1 | 10/1999 |
| WO | WO-00/48258 | 8/2000 |
| WO | WO-00/53656 | 9/2000 |
| WO | WO-00/55927 | 9/2000 |
| WO | WO-01/19142 | 3/2001 |
| WO | WO-01/66618 A1 | 9/2001 |
| WO | WO-01/81649 | 11/2001 |
| WO | WO-02/28983 | 4/2002 |
| WO | WO-02/31896 | 4/2002 |
| WO | WO-02/44189 A1 | 6/2002 |
| WO | WO-02/45466 A1 | 6/2002 |
| WO | WO-02/063700 | 8/2002 |
| WO | WO-02/066552 A1 | 8/2002 |
| WO | WO-02/068435 A1 | 9/2002 |
| WO | WO-02/081448 A1 | 10/2002 |
| WO | WO-02/092723 A1 | 11/2002 |
| WO | WO-03/001616 | 1/2003 |
| WO | WO-03/018653 | 3/2003 |
| WO | WO-03/091355 A2 | 11/2003 |
| WO | WO-2004/034751 A1 | 4/2004 |
| WO | WO-2004/047197 | 6/2004 |

OTHER PUBLICATIONS

Baldo et al., "Phosphorescent Materials for Application to Organic Light Emitting Devices," *Pure Appl. Chem.*, vol. 71, No. 11, pp. 2095-2106 (1999).

Baldo et al., "Very Hight-Efficiency Green Organic Light-Emitting Devices Based on Electrophosphorescence," *Appl. Phys. Lett.*, vol. 75, No. 1, pp. 4-6 (1999).

Bernius et al., "Progress with Light-Emitting Polymers," *Adv. Mater.*, vol. 12, No. 23, pp. 1737-1750 (2000).

Brown et al., "Optical Spectroscopy of Triplet Excitons and Charged Excitations in Poly($p$-phenylenevinylene) Light-Emitting Diodes," *Chem. Phys. Letter*, vol. 210, No. 1-3, pp. 61-66 (1993).

Chen et al., "Triplet Exciton Confinement in Phosphorescent Polymer Light-Emitting Diodes," *Appl. Phys. Lett.*, vol. 82, No. 7, pp. 1006-1008 (2003).

Cleave et al., "Harvesting Singlet and Triplet Energy in Polymer LEDs," *Adv. Mater.*, vol. 11, No. 4, pp. 285-288 (1999).

Domercq et al., "Photo-crosslinkable Polymers as Hole-Transport Materials for Organic Light-Emitting Diodes," *Proc. SPIE*, vol. 4642, pp. 88-96 (2000).

Gong et al., "Electrophosporescence from a Conjugated Copolymer Doped with an Iridium Complex: High Brightness and Improved Operational Stability," *Adv. Mater.*, vol. 15, No. 1, pp. 45-49 (2003).

Hung et al., "Recent Progress of Molecular Organic Electroluminescent Materials and Devices," *Materials Science & Engineering*, vol. 39, pp. 143-222 (2002).

Ikai et al., "Highly Efficient Phosphorescence from Organic Light-Emitting Devices with an Exciton-Block Layer," *Appl. Phys. Lett.*, vol. 79, No. 2, pp. 156-158 (2001).

Il et al., "A blue light emitting copolymer with charge transporting and photo-corosslinkable functional units," Synthetic Metals, 84:437-438 (1997).

International Search Report received in International (PCT) Application No. PCT/GB2004/005392, dated Jun. 14, 2005.

International Preliminary Report on Patentability (IPRP) for International Appl. No. PCT/GB2004/005392, dated Jun. 20, 2006.

Kim et al., "Synthesis and Properties of Novel Triphenylamine Polymers Containing Ethynyl and Aromatic Moieties,:" *Synth. Metals*, vol. 122, pp. 363-368 (2001).

Lane et al., "Origin of Electrophosphorescence from a Doped Polymer Light Emitting Diode," *Phys. Rev. B*, vol. 63, pp. 235206-1-235208-8 (2001).

Lee et al., "Polymerophosphorescent Light-Emitting Devices Doped with Tris(2-phenylpyridine) Iridium as a Triplet Emitter," *Appl. Phys. Lett.*, vol. 77, No. 15, pp. 2280-2282 (2000).

McGehee et al., "Narrow Bandwidth Luminescence from Blends with Energy Transfer from Semiconducting Conjugated Polymers to Europium Complexes," *Adv. Mater.*, vol. 11, pp. 1349-1354 (1999).

Muller et al., "Multi-Colour Organic Light-Emitting Displays by Solution Processing," *Nature*, vol. 421, pp. 829-833 (2003) (Abstract).

Noh et al., "Energy Transfer and Device Performance in Phosphorescent Dye Doped Polymer Light Emitting Diodes," *J. Chem. Phys.*, vol. 118, No. 6, pp. 2853-2865 (2003).

Noh et al., "Singlet and Triplet Energy Transfer in Phosphorescent Dye Doped Polymer Light Emitting Devices," *Mat. Res. Soc. Symp. Proc.*, vol. 708, pp. 131-136 (2002).

O'Brien et al., "Electrophosphoresence from a Doped Polymer Light Emitting Diode," *Synth. Met.*, vol. 116, pp. 379-383 (2001).

Polymeric Materials Science and Engineering, vol. 83, pp. 202-203 (2000).

Shirota, "Organic Materials for Electronic and Optoelectronic Devices," *J. Mater. Chem.*, vol. 10, pp. 1-25 (2000).

(56) References Cited

OTHER PUBLICATIONS

Thompson et al., "Electrophosphorescent Organic Light Emitting Diodes," *Polymeric Mater Sci Eng.,* vol. 83, pp. 202-203 (2000).
Wohlgenannt et al., "Formation Cross-Sections of Singlet and Triplet Excitons in Pi-Conjugated Polymers," *Nature,* vol. 409, No. 6819, pp. 494-497 (2001) (Abstract).
Zhu et al., "Synthesis of New Iridium Complexes and Their Electrophosphorescent Properties in Polymer Light-Emitting Diodes," *J. Mater. Chem.,* vol. 13, pp. 50-55 (2003).
Wohlgenannt et al., "Photophysics Properties of Blue-Emitting Polymers," Synth. Met., 125(1):55-63 (2001) (Abstract).
Great Britain Search Report for GB0329364.4, dated Jun. 2, 2004.
Office Action for corresponding European Patent Application No. EP 04 806 189.9-222, dated Apr. 17, 2009.
Notifications of Reasons for Refusal (English translation), Japanese Patent Application No. 2016077082, Nov. 10, 2016 (date of drafting), Nov. 22, 2016 (mailing date).

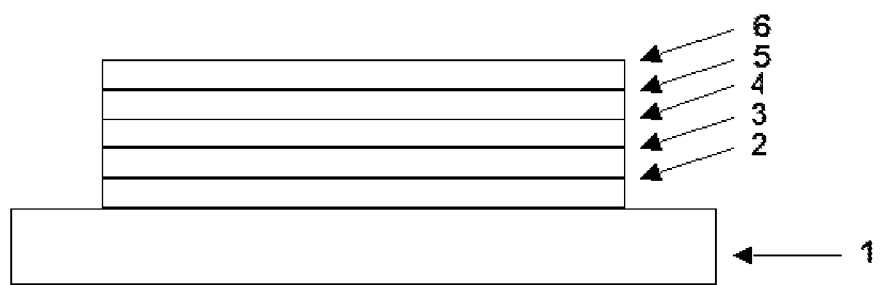

OPTICAL DEVICE COMPRISING A CHARGE TRANSPORT LAYER OF INSOLUBLE ORGANIC MATERIAL AND METHOD FOR THE PRODUCTION THEREOF

FIELD OF THE INVENTION

This invention relates to organic optical devices comprising a layer of insoluble organic material and methods for the production thereof.

BACKGROUND OF THE INVENTION

Organic semiconductors are now frequently used in a number of optical devices such as in organic light emitting diodes ("OLEDs") as disclosed in WO 90/13148, photovoltaic devices as disclosed in WO 96/16449 and photodetectors as disclosed in U.S. Pat. No. 5,523,555.

A typical OLED comprises a substrate, on which is supported an anode (commonly indium tin oxide or "ITO"), a cathode and an organic electroluminescent layer between the anode and cathode. In operation, holes are injected into the device through the anode and electrons are injected into the device through the cathode. The holes and electrons combine in the organic electroluminescent layer to form an exciton which then undergoes radiative decay to give light. Other layers may be present in the OLED, for example a layer of organic hole injection material such as poly(ethylene dioxy thiophene)/polystyrene sulfonate (PEDT/PSS) may be provided between the anode and the organic electroluminescent layer to assist injection of holes from the anode to the organic electroluminescent layer.

Various classes of organic light emitting materials are known, in particular: polymers such as poly(p-phenylenevinylene) (as disclosed in WO 90/13148), polyfluorenes and polyphenylenes; the class of materials known as small molecule materials such as tris-(8-hydroxyquinoline)aluminium ("Alq$_3$") as disclosed in U.S. Pat. No. 4,539,507; and the class of materials known as dendrimers as disclosed in WO 99/21935. These materials electroluminesce by radiative decay of singlet excitons (i.e. fluorescence) however spin statistics dictate that up to 75% of excitons are triplet excitons which undergo non-radiative decay, i.e. quantum efficiency may be as low as 25% for fluorescent OLEDs—see, for example, Chem. Phys. Lett., 1993, 210, 61, Nature (London), 2001, 409, 494, Synth. Met, 2002, 125, 55 and references therein.

Accordingly, considerable effort has been directed towards producing luminescence from triplet excitons (phosphorescence) by utilizing spin-orbit coupling effects in metal complexes that enable triplet excitons to undergo radiative decay. The metal complex is doped into a host material from which it receives charge and/or triplet excitons. Examples of complexes investigated for this purpose include lanthanide metal chelates [Adv. Mater., 1999, 11, 1349], a platinum (II) porphyrin [Nature (London), 1998, 395, 151] and tris(phenylpyridine) iridium (III) (hereinafter "Ir(ppy)$_3$") [Appl. Phys. Lett., 1999, 75, 4; Appl. Phys. Lett., 2000, 77, 904]. Fuller reviews of such complexes may be found in Pure Appl. Chem., 1999, 71, 2095, Materials Science & Engineering, R: Reports (2002), R39(5-6), 143-222 and Polymeric Materials Science and Engineering (2000), 83, 202-203.

Prior art phosphorescent OLEDs often comprise charge transporting and/or charge blocking layers used in conjunction with the electroluminescent layer in order to maximize device efficiency. The charge transporting/blocking layers and the electroluminescent layers are typically formed by vacuum evaporation of the appropriate materials in sequence.

Deposition of materials from solution, for example by spin-coating or inkjet printing, offers advantages over vacuum deposition such as simplified processing. However, solution deposition of multiple layers is complicated by the tendency of initially cast or deposited layers to dissolve in the solvents used for succeeding layers. Thus, solution deposition will commonly be employed for one layer only. For example, U.S. 2002/096995 discloses spin-coating of an electroluminescent layer of polyvinylcarbazole (hereinafter "PVK") host doped with Ir(ppy)$_3$ emitter onto a substrate of ITO and PEDT/PSS. A layer of electron transporting material is then deposited by vacuum evaporation.

One solution to this problem is disclosed in JP 2003-077673 wherein a hole transporting layer of PVK is formed by spin-coating from 1,2-dichloroethane solution followed by formation of an electroluminescent layer of 9,9-dioctylfluorene host/Ir(ppy)$_3$ emitter by spin-coating from xylene solution. The formation of this bilayer by solution processing is possible due to the low solubility of PVK in the xylene solvent used for the electroluminescent layer. This approach is limited in that the material used for the first layer can only be selected from those that do not dissolve in the solvent used for the second layer.

Another solution to this problem is disclosed in JP 2002-050482 wherein a first layer of insoluble poly(phenylenevinylene) (hereinafter "PPV") is formed by deposition by spin-coating of a soluble precursor compound, followed by thermal conversion of the precursor to insoluble PPV. A layer of PVK host/Ir(ppy)$_3$ guest is then deposited onto the insoluble PPV layer. Again, this approach is limited in that it is only applicable to insoluble compounds that have a soluble precursor form. Furthermore, the thermal conversion required by these precursors requires forcing conditions and generates corrosive by-products that may harm the performance of the finished device.

SUMMARY OF THE INVENTION

The present inventors have found that a phosphorescent OLED comprising a plurality of solution processable layers may be formed by treatment of a solution processable layer to render it insoluble.

Accordingly, in a first aspect the invention provides a method of forming an organic light emitting diode comprising the steps of:

providing a substrate comprising a first electrode for injection of charge carriers of a first type forming a charge transporting layer by depositing over the substrate a charge transporting material for transporting charge carriers of the first type, the charge transporting material being soluble in a solvent;

treatment of the charge transporting layer to render it insoluble in the solvent;

forming an electroluminescent layer by depositing onto the charge transporting layer a composition comprising the solvent, a phosphorescent material and a host material; and depositing over the electroluminescent layer a second electrode for injection of charge carriers of a second type.

Preferably, the first electrode is an anode; the second electrode is a cathode; the charge carriers of the first type are holes; and the charge carriers of the second type are electrons.

Preferably, the charge transporting material is deposited from solution. The solvent used for such a solution may be the same as or different to the solvent used to deposit the electroluminescent layer.

In one embodiment, the charge transporting material comprises a cross-linkable material and the treatment comprises subjecting the charge transporting layer to heat or electromagnetic radiation, in particular UV radiation, in order to cross-link the charge transporting material.

The present inventors have surprisingly found that the charge transporting layer may be rendered insoluble in the solvent even when cross-linking groups are absent. Accordingly, in another embodiment the charge transporting layer is substantially free of cross-linkable groups and the treatment comprises subjecting the charge transporting layer to heat.

Following the aforementioned treatment, it may be possible to solubilize the charge transporting layer under forcing conditions (e.g. by exposure to the solvent at elevated temperature and/or immersion in the solvent over a prolonged period), particularly in the case where the charge transporting layer is substantially free of cross-linkable groups. In this case, the present inventors have found that at least part of the charge transporting layer remains intact under conditions typically employed for deposition of the electroluminescent layer, although an upper part of the charge transporting layer may dissolve upon contact with the solvent. The term "insoluble" should be construed accordingly.

Partial dissolution of the charge transporting layer may be desirable in order to form a mixed region between the charge transporting layer and the electroluminescent layer. The extent of this partial dissolution may be controlled by appropriate selection of conditions for insolubilization of the charge transporting layer. Thus, use of cross-linking groups will typically result in insolubilization of the whole of the charge transporting layer as deposited. Alternatively, selection of time and temperature for heat treatment of a charge transporting layer that is substantially free of cross-linkable groups may be used to control the extent of insolubilization of the charge transporting layer as deposited.

Preferably, the charge transporting material is a polymer.

Preferably, the polymer comprises an optionally substituted triarylamine repeat unit.

Preferably, the triarylamine repeat unit comprises an optionally substituted first repeat unit of formula (I):

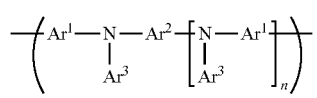

(I)

wherein each $Ar^1$, $Ar^2$ and $Ar^3$ is the same or different and independently represents optionally substituted aryl or heteroaryl; and n is 0 or 1.

Preferably, $Ar^1$ is phenylene.

Preferably, $Ar^2$ is 1,4-phenylene or 4,4'-biphenylene. When n is 0, $Ar^2$ is preferably 1,4-phenylene. When n is 1, $Ar^2$ is preferably 1,4-phenylene or 4,4'-biphenylene.

Preferably, $Ar^3$ is phenyl. $Ar^3$ may be substituted or unsubstituted; preferably $Ar^3$ is substituted with a solubilizing group, more preferably optionally substituted $C_{20}$ alkyl or $C_{20}$ alkoxy.

Preferably, the polymer is a copolymer comprising two or more repeat units. Preferably, one of the repeat units of such a copolymer is the first repeat unit of formula (I). More preferably, the copolymer comprises a second repeat unit selected from optionally substituted fluorene, indenofluorene, spirofluorene and phenylene.

Preferably, the phosphorescent material is a metal complex.

Preferably, the host material is a host polymer.

Preferably, the host polymer is a polymer comprising a triarylamine repeat unit as defined above, preferably a first repeat unit.

In a second aspect, the invention provides an organic light emitting diode obtainable by the method according to the first aspect of the invention.

In another aspect, the invention provides an organic light emitting diode comprising, in sequence, an anode; a hole transporting layer; an electroluminescent layer comprising a phosphorescent material and a host material; and a cathode, wherein the hole transporting layer is a polymer comprising an optionally substituted repeat unit of formula (I):

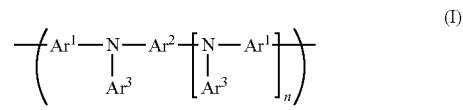

(I)

wherein each $Ar^1$, $Ar^2$ and $Ar^3$ is the same or different and independently represents optionally substituted aryl; and n is 0 or 1.

Preferably, the polymer comprises a repeat unit selected from optionally substituted fluorene, indenofluorene, spirofluorene and phenylene.

Preferably, a hole injecting layer comprising a conductive organic material is located between the anode and the hole transporting layer.

Preferably, the phosphorescent material is a metal complex.

In a third aspect, the invention provides an organic light emitting diode comprising a first electrode for injection of charge carriers of a first type; a second electrode for injection of charge carriers of a second type; an electroluminescent layer between the first and second electrodes comprising a phosphorescent material and a host material; wherein a mixed layer comprising a mixture of a charge transporting material for transporting charge carriers of the first type, the phosphorescent material and the host material is located between the charge transporting layer and the electroluminescent layer.

Preferably, the mixed layer comprises a concentration gradient across its thickness wherein the concentration of charge transporting material decreases with distance from the first electrode.

Preferably, the first electrode is an anode, the second electrode is a cathode and the charge transporting material is a hole transporting material.

In a fourth aspect, the invention provides a method of forming a device according to the third aspect of the invention comprising the steps of:

providing a substrate comprising a first electrode for injection of charge carriers of a first type;

depositing over the substrate a charge transporting material for transporting charge carriers of the first type, the charge transporting material being soluble in a solvent;

forming an electroluminescent layer by depositing onto the charge transporting layer a composition comprising the solvent, a phosphorescent material and a host material; and depositing over the electroluminescent layer a second electrode for injection of charge carriers of a second type.

The method of the fourth aspect will result in at least partial dissolution of the charge transporting material upon deposition of the electroluminescent layer.

The extent to which the charge transporting material dissolves may be controlled by appropriate treatment of the charge transporting material following its deposition as described above with respect to dissolution of the charge transporting layer of the first aspect of the invention.

Preferably, the first electrode is an anode, the second electrode is a cathode and the charge transporting material is a hole transporting material.

In a fifth aspect, the invention provides a method of forming a device according to the third aspect of the invention comprising the steps of:

providing a substrate comprising a first electrode for injection of charge carriers of a first type;

depositing over the substrate a composition comprising a solvent, a phosphorescent material, a host material and charge transporting material for transporting charge carriers of the first type;

phase-separating the composition during evaporation of the solvent such that the charge transporting material migrates towards the first electrode; and depositing over the electroluminescent layer a second electrode for injection of charge carriers of a second type.

The method according to the fifth aspect provides a method of forming a device comprising a mixed region and/or a charge transporting layer. Preferably, the phase separation of the charge transporting material, electroluminescent material and host material results in mixed region comprising a concentration gradient across its thickness wherein the concentration of charge transporting material decreases with distance from the first electrode.

Preferably, the first electrode is an anode; the second electrode is a cathode; and the charge transporting material is a hole transporting material.

Preferably, the phosphorescent material and host material according to the fifth aspect are components of the same molecule.

Preferably, the composition is deposited onto a layer of conductive organic material provided over the first electrode. Preferably, the conductive organic material comprises doped poly(ethylenedioxythiophene), more preferably poly(ethylenedioxythiophene) doped with poly(styrene sulfonate).

Preferably, the charge transporting material is a polymer, more preferably a polymer comprising a triarylamine repeat unit, most preferably a triarylamine repeat unit of formula (I).

The present inventors have found that phosphorescence of a phosphorescent OLED may be quenched if the electroluminescent layer is adjacent to a low triplet energy level charge transporting material.

Accordingly, in a sixth aspect, the invention provides an organic light emitting diode comprising, in sequence, a first electrode for injection of charge carriers of a first type; a first charge transporting layer comprising a first charge transporting material for transporting charge carriers of the first type; an electroluminescent layer adjacent to the charge transporting layer and comprising a phosphorescent material and a host material; and a second electrode for injection of charge carriers of a second type, wherein the first charge transporting material has a higher triplet energy level than the phosphorescent material.

Although low triplet energy level charge transporting or injecting materials may be undesirable if placed adjacent to the electroluminescent layer, such materials may serve to optimize device performance if they are placed remote from the electroluminescent layer.

Accordingly, it is preferred that a second charge transporting layer for transport of charge carriers of the first type is provided between the first electrode and the first charge transporting layer.

Similarly, it may be desirable to provide a charge injecting layer comprising a conductive organic material for injecting charge carriers of the first type remote from the electroluminescent layer to prevent any quenching that may occur if these layers are adjacent (e.g. quenching by a polaron band of the conductive organic material).

Accordingly, it is preferred that a conductive organic material for injection of charge carriers of the first type is provided between the first electrode and the first charge transporting layer.

Preferably, the conductive organic material comprises doped poly(ethylenedioxythiophene) more preferably poly(ethylenedioxythiophene) doped with poly(styrene sulfonate).

Preferred charge transporting materials, host materials and electroluminescent materials for the third, fourth, fifth and sixth aspects of the invention are as described with respect to the first aspect of the invention.

BRIEF DESCRIPTION OF THE DRAWINGS

The invention will now be described in further detail, by way of example only, with reference to the accompanying drawings in which:

The FIGURE shows an OLED prepared according to the method of the invention.

DETAILED DESCRIPTION OF THE INVENTION

With reference to the FIGURE, an organic light emitting diode prepared according to the method of the invention comprises a substrate 1, an anode 2 of indium tin oxide, a layer 3 of organic hole injection material, an insoluble hole transporting layer 4, an electroluminescent layer 5 and a cathode 6.

Optical devices tend to be sensitive to moisture and oxygen. Accordingly, the substrate 1 preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

Although not essential, the presence of layer 3 of organic hole injection material is desirable as it assists hole injection from the anode into the layer or layers of semiconducting polymer. Examples of organic hole injection materials include PEDT/PSS as disclosed in EP 0901176 and EP 0947123, or polyaniline as disclosed in U.S. Pat. No. 5,723,873 and U.S. Pat. No. 5,798,170.

Cathode 6 is selected in order that electrons are efficiently injected into the device and as such may comprise a single conductive material such as a layer of aluminum. Alternatively, it may comprise a plurality of metals, for example a bilayer of calcium and aluminum as disclosed in WO 98/10621. A thin layer of dielectric material such as lithium fluoride may be provided between the electroluminescent layer 5 and the cathode 6 to assist electron injection as disclosed in, for example, WO 00/48258.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container, optionally with a desiccant, as disclosed in, for example, WO 01/19142.

In a practical device, at least one of the electrodes is semi-transparent in order that light may be emitted. Where the anode is transparent, it typically comprises indium tin oxide. Examples of transparent cathodes are disclosed in, for example, GB 2348316.

A typical electroluminescent device comprises an anode having a work function of 4.8 eV. Accordingly, the HOMO level of the hole transporting material for hole transporting layer 4 is preferably around 4.8-5.5 eV. Suitable hole transporting materials are small molecules, polymers and dendrimers comprising optionally substituted triarylamine units, in particular triphenylamine units, and materials comprising carbazole units.

The hole transporting layer 4 may also serve as an electron blocking layer. Electron blocking functionality is provided if the hole transporting layer 4 possesses a shallower (i.e. less positive) LUMO level(s) than the host material and the phosphorescent dopant. For a typical device architecture, suitable LUMO level for the hole transporting layer 4 is about 1.6-2.3 eV.

The hole transporting layer 4 may also serve as an exciton blocking layer. Exciton blocking functionality is provided if the hole transporting layer 4 has (a) a wider HOMO-LUMO bandgap and (b) a wider $T_1$-$T_0$ energy gap than the phosphorescent dopant.

Preferred hole transporting materials for hole transporting layer 4 are polymers comprising triarylamine repeat units such as polymers having repeat units 1-6:

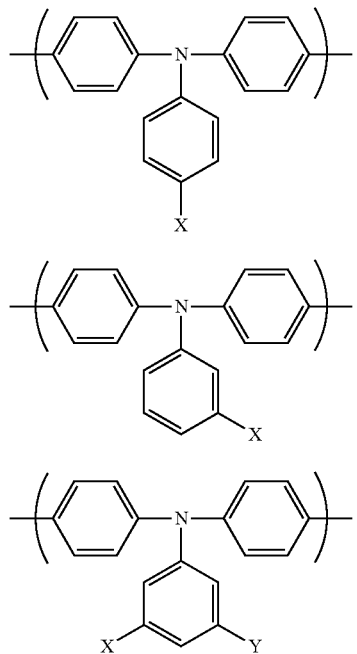

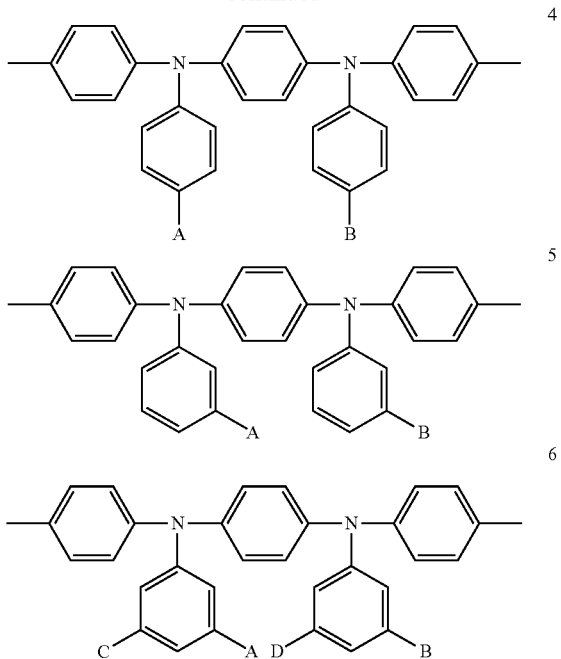

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl. The repeat unit of formula 1 is most preferred.

These polymers may be homopolymers or copolymers. Where they are copolymers, suitable co-repeat units are optionally substituted arylenes such as fluorenes as disclosed in Adv. Mater. 2000 12(23) 1737-1750, particularly 2,7-linked 9,9-dialkyl fluorene, 9,9-diaryl fluorene or 9-alkyl-9-aryl fluorene; a spirofluorene such as 2,7-linked spirobifluorene as disclosed in EP 0707020; an indenofluorene such as a 2,7-linked indenofluorene; or a phenylene such as alkyl or alkoxy substituted 1,4-phenylene. Each of these repeat units may be substituted. These copolymers are particularly advantageous because they have good film forming properties and may be readily formed by Suzuki or Yamamoto polymerization which enables a high degree of control over the regioregularity of the resultant polymer.

Preferred polyfluorenes comprise repeat units of formula (II):

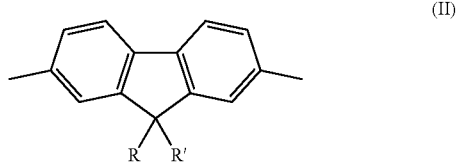

wherein R and R' are independently selected from hydrogen or optionally substituted alkyl, alkoxy, aryl, arylalkyl, heteroaryl and heteroarylalkyl, and at least one of R and R' is not hydrogen. More preferably, at least one of R and R' comprises an optionally substituted $C_1$-$C_{20}$ alkyl group, more preferably $C_4$-$C_{10}$ alkyl group.

Preferably, the first semiconducting polymer comprises a 1:1 regular, alternating copolymer of a fluorene repeat unit and a triarylamine repeat unit.

Another suitable hole transporting polymer is poly(vinyl carbazole).

To avoid any quenching of phosphorescence by the hole transporting layer when used with high triplet energy materials such as green phosphorescent materials, the hole transporting polymer may be selected so as to have repeat units that increase the triplet energy of the polymer as compared to repeat units of formula (II). Suitable repeat units of this type include non-planar repeat units and repeat units that are partially or fully non-conjugated.

Non-planar repeat units include units containing a twist caused by steric interaction between a substituent of the non-planar repeat unit and ring bearing substituents capable of inducing a twist between adjacent ring systems by steric interaction.

One class of repeat unit capable of producing a twist in the polymer backbone is that comprising an optionally substituted repeat unit of formula (III):

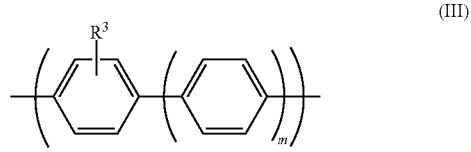

(III)

wherein m is 0, 1 or 2 and $R^3$ is a substituent, preferably an optionally substituted alkyl, alkoxy, aryl, aryloxy, heteroaryl or heteroaryloxy group, more preferably a $C_{1-10}$ alkyl group.

The group $R^3$ induces a twist by steric interaction with the phenyl group of the repeat unit of formula (III) adjacent to the phenyl group that $R^3$ is attached to. In this case, preferred repeat units include repeat units of formulae (IV), (V) or (VI):

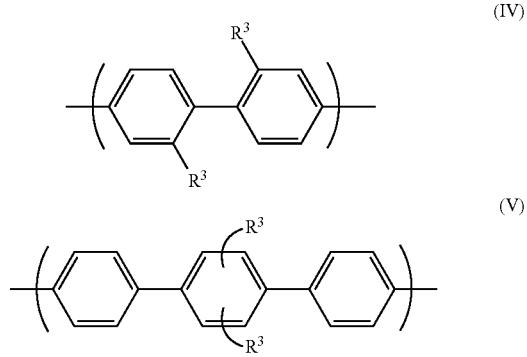

(IV)

(V)

Alternatively, the group $R^3$ may induce a twist by steric interaction with a repeat unit adjacent to the repeat unit of formula (III). In this case, $R^3$ is attached to the carbon atom adjacent to the carbon atom of the repeat unit that is linked to said adjacent repeat unit.

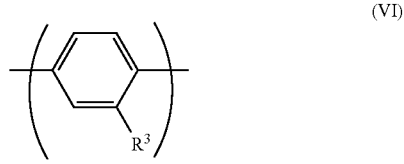

(VI)

Examples of partially or fully non-conjugated repeat units for higher triplet energy hole transporting polymers have formulae 7-10 (dotted lines show bonds for linkage to further repeat units). Repeat units having an aryl group at either end are particularly advantageous because they are readily formed from the appropriate monomers by Suzuki or Yamamoto polymerisation.

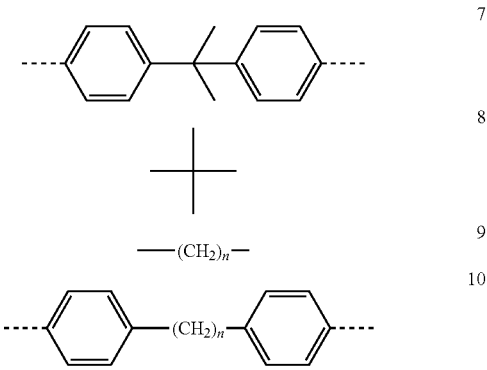

7

8

9

—(CH$_2$)$_n$—

10

Another class of repeat units for high triplet energy polymers are optionally substituted, 3,6-linked fluorene or carbazole repeat units.

The hole transporting material is soluble in at least some organic solvents, in particular to allow its deposition from solution and/or to allow intermixing upon deposition of the electroluminescent layer from such a solvent. Following deposition, the hole transporting material is treated so as to render it insoluble.

One suitable treatment entails cross-linking of cross-linkable groups that are either bound to or blended with the hole transporting material. Suitable cross-linkable groups include oxetanes as disclosed in Nature 421, 829-833, 2003; azides; acrylates as disclosed in WO 96/20253; vinyl groups as disclosed in U.S. Pat. No. 6,107,452; and ethynyl groups as disclosed in Kim et al., Synthetic Metals 122 (2001), 363-368. Cross-linking may be achieved through thermal treatment or exposure of the hole transporting layer to radiation, in particular UV radiation.

The hole transporting layer may be rendered insoluble even if no cross-linkable groups are present within it by an appropriate insolubilization treatment. The hole transporting layer is then stable to solution deposition of the electroluminescent layer. The present inventors have found that this insoluble layer forms (a) regardless of whether a PEDT/PSS layer is used or not (although presence of PEDT/PSS is preferred) and (b) in air or in a nitrogen only environment. However, the present inventors have found that it is necessary to subject the hole transporting layer to an insolubilizing treatment in order to maximize device performance, and in particular to minimize mixing of the second layer with the first layer by increasing the insolubility of the first layer. Without wishing to be bound by any theory, possible mechanisms for loss of solubility of the hole transporting layer upon insolubilization treatment when no cross-linkable groups are present include formation of a relatively solvent impermeable surface or an adhesion to the surface that the hole transporting layer following elimination of solvent from a solution deposited hole transporting layer.

Means for eliminating solvent include vacuum treatment and/or heat treatment. Heat treatment, either alone or in combination with vacuum treatment, is preferred. For heat treatment, a suitable treatment period is in the range 5 minutes-2 hours. The heat treatment temperature is preferably above the glass transition temperature of the hole transporting material.

Preferably, the hole transporting layer has a thickness in the range 10-20 nm. If a hole transporting polymer is used to form the hole transporting layer 4, its thickness may be modified by appropriate selection of molecular weight (Mw) of the polymer. Thus, Mw of 50,000 may give a thickness as low as about 2 nm, but up to about 15-20 nm for Mw of around 250,000-300,000.

The electroluminescent layer 5 is deposited directly onto the hole transporting layer 4 and comprises a host material and a phosphorescent dopant. It is necessary for the host to possess a higher $T_1$ energy level than the dopant. Examples of suitable host materials are small molecules comprising triarylamine units (for examples see Shirota, J. Mater. Chem., 2000, 10, 1-25); polymers comprising triarylamine repeat units as described above; or carbazole units, in particular poly(vinylcarbazole).

The host material may also have charge transporting properties. Hole transporting host materials are particularly preferred such as the optionally substituted hole-transporting arylamine having the following formula:

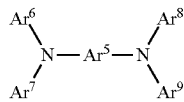

wherein $Ar^5$ is an optionally substituted aromatic group, such as phenyl, or

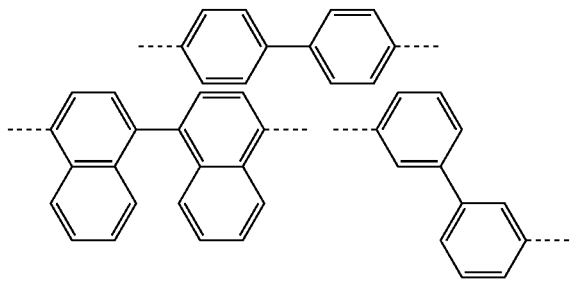

and $Ar^6$, $Ar^7$, $Ar^8$ and $Ar^9$ are optionally substituted aromatic or heteroaromatic groups (Shi et al (Kodak) U.S. Pat. No. 5,554,450. Van Slyke et al, U.S. Pat. No. 5,061,569. So et al (Motorola) U.S. Pat. No. 5,853,905 (1997)). Ar is preferably biphenyl. At least two of $Ar^6$, $Ar^7$, $Ar^8$ and $Ar^9$ may be bonded to either a thiol group, or a group containing a reactive unsaturated carbon-carbon bond. $Ar^6$ and $Ar^7$ and/or $Ar^8$ and $Ar^9$ are optionally linked to form a N containing ring, for example so that the N forms part of a carbazole unit e.g.

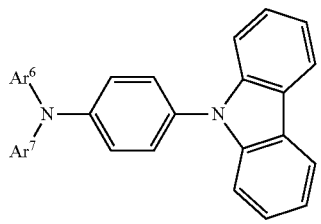

Host materials may alternatively possess electron transporting properties. Examples of electron transporting host materials are azoles, diazoles, triazoles, oxadiazoles, benzoxazoles, benzazoles and phenanthrolines, each of which may optionally be substituted. Particularly preferred substituents are aryl groups, in particular phenyl. oxadiazoles, in particular aryl-substituted oxadiazoles. These host materials may exist in small molecule form or may be provided as repeat units of a polymer, in particular as repeat units located in the backbone of a polymer or as substituents pendant from a polymer backbone. Specific examples of electron transporting host materials include 3-phenyl-4-(1-naphthyl)-5-phenyl-1,2,4-triazole and 2, 9-dimethyl-4,7-diphenyl-phenanthroline.

Host materials may be bipolar, i.e. capable of transporting holes and electrons. Suitable bipolar materials preferably contain at least two carbazole units (Shirota, J. Mater. Chem., 2000, 10, 1-25). In one preferred compound, both $Ar^6$ and $Ar^7$ and $Ar^8$ and $Ar^9$ as described above are linked to form carbazole rings and $Ar^5$ is phenyl. Alternatively, a bipolar host material may be a material comprising a hole transporting segment and an electron transporting segment. An example of such a material is a polymer comprising a hole transporting segment and an electron transporting segment as disclosed in WO 00/55927 wherein hole transport is provided by a triarylamine repeat unit located within the polymer backbone and electron transport is provided by a conjugated polyfluorene chain within the polymer backbone. Alternatively, the properties of hole transport and electron transport may be provided by repeat units pendant from a conjugated or non-conjugated polymer backbone.

Specific examples of "small molecule" hosts include 4,4'-bis(carbazol-9-yl)biphenyl), known as CBP, and (4,4', 4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA.

Homopolymers and copolymers may be used as hosts, including optionally substituted polyarylenes such as polyfluorenes, polyspirofluorenes, polyindenofluorenes or polyphenylenes as described above with respect to the hole transporting layer.

Specific examples of host polymers disclosed in the prior art include poly(vinyl carbazole) disclosed in, for example, Appl. Phys. Lett. 2000, 77 (15), 2280; polyfluorenes in Synth. Met. 2001, 116, 379, Phys. Rev. B 2001, 63, 235206 and Appl. Phys. Lett. 2003, 82 (7), 1006; poly[4-(N-4-vinylbenzyloxyethyl, N-methylamino)-N-(2,5-di-tert-butylphenylnapthalimide] in Adv. Mater. 1999, 11 (4), 285; poly(para-phenylenes) in J. Mater. Chem. 2003, 13, 50-55; poly[9,9'-di-n-hexyl-2,7-fluorene-alt-1,4-(2,5-di-n-hexyloxy)pheny-lene] as a host for both fac-tris(2-phenylpyridine) iridium(III) and 2,3,7,8,12,13,17,18-octaethyl-21H, 23H-porphyrin platinum(II) in J. Chem. Phys. (2003), 118 (6), 2853-2864; a random copolymer host of dioctylfluorene and dicyano-benzene in Mat. Res. Symp. Spring Meeting 2003 Book of Abstracts, Heeger, p. 214; and an AB copolymer of a fluorene repeat unit and phenylene repeat unit is disclosed in Mat. Res. Soc. Symp. Proc. 708, 2002, 131.

Suitable phosphorescent dopants are metal complexes based on heavy elements M that induce strong spin-orbit coupling to allow rapid intersystem crossing and emission from triplet states. Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission color is determined by the choice of the metal. The sharp emission is generally narrow, resulting in a pure color emission useful for display applications.

The d-block metals form organometallic complexes with carbon or nitrogen donors such as porphyrin or bidentate ligands of formula (VII):

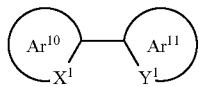

(VII)

wherein $Ar^{10}$ and $Ar^{11}$ may be the same or different and are independently selected from optionally substituted aryl or heteroaryl; $X^1$ and $Y^1$ may be the same or different and are independently selected from carbon or nitrogen; and $Ar^{10}$ and $Ar^{11}$ may be fused together. Ligands wherein $X^1$ is carbon and $Y^1$ is nitrogen, or wherein $X^1$ and $Y^1$ are both nitrogen are particularly preferred.

Examples of bidentate ligands are illustrated below:

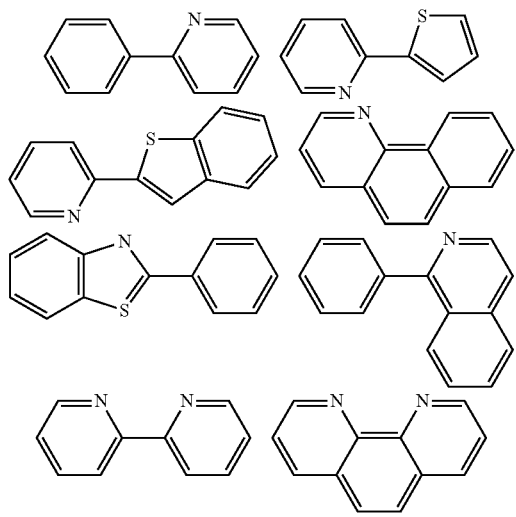

One or both of $Ar^{10}$ and $Ar^{11}$ may carry one or more substituents. Particularly preferred substituents include fluorine or trifluoromethyl which may be used to blue-shift the emission of the complex as disclosed in WO 02/45466, WO 02/44189, U.S. 2002-117662 and U.S. 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalize the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

The concentration of the phosphorescent light-emitting dopant in the host material should be such that the film has a high electroluminescent efficiency. If the concentration of the emissive species is too high, quenching of luminescence can occur. A concentration in the range 0.0149 wt %, more preferably 0.5-10 wt %, most preferably 1-3 wt % is generally appropriate.

The host material and the electroluminescent material may be provided as separate materials as described above. Alternatively, they may be components of the same molecule. For example, a phosphorescent metal complex may be provided as repeat unit, sidechain substituent or end-group of a host polymer as disclosed in, for example, WO 02/31896, WO 03/001616, WO 03/018653 and EP 1245659. Likewise, a "small molecule" host material may be bound directly to a ligand of a phosphorescent metal complex.

The phosphorescent material is typically employed as a dopant within the host material at low (ca. 1-5%) concentration. It will therefore be appreciated that solubility of the phosphorescent material in a given solvent may be correspondingly low. Alternatively, a phosphorescent material having enhanced solubility may be employed. Such phosphorescent materials include complexes bearing alkyl or alkoxy groups as disclosed in JP 2002-324679; dendrimers as disclosed in WO 02/66552: and phosphorescent complexes provided as repeat units, sidechain substituents or end-groups of soluble polymers as disclosed in WO 02/31896, WO 03/001616, WO 03/018653 and EP 1245659.

Suitable solution processing techniques for deposition of the hole transporting layer and the electroluminescent layer include spin-coating, inkjet printing as disclosed in EP 0880303, laser transfer as described in EP 0851714, flexographic printing, screen printing and doctor blade coating. Provision of such solubilizing groups as described above may be particularly advantageous for rendering the phosphorescent material more suitable for solution processing techniques such as inkjet printing.

Following the aforementioned treatment, the hole transporting layer may be entirely insoluble or partially insoluble. In the case where the hole transporting material is substantially free of cross-linkable groups, the degree of insolubility may vary with the duration and/or temperature of heat treatment. Any soluble hole transporting material may be removed from the layer by rinsing in an appropriate solvent in order to leave an entirely insoluble layer, however the invention also encompasses deposition of the electroluminescent layer wherein the first layer has been rendered only partially insoluble and the soluble portion has not been removed. In this instance there will be some blending between the materials of the hole transporting layer and the electroluminescent layer. This may be advantageous in both providing a hole transporting layer and an electroluminescent layer comprising some hole transporting material, thus creating a gradient of increasing concentration of hole transporting material in moving from the cathode towards the anode.

The hole transporting material, the host material and the phosphorescent material according to the invention must be at least partially soluble in a common solvent. Suitable solvents for deposition of the electroluminescent layer and (where solution deposited) the hole transport layer will be apparent to the skilled person. For example, alkyl- or alkoxy-substituted polyarylenes such as polyfluorenes, polyphenylenes and polyindenofluorenes are typically soluble in aromatic hydrocarbons, more preferably mono- or polyalkylated or alkoxylated benzene such as toluene ethylbenzene and cyclohexylbenzene; polyalkylbenzenes, for example xylene, trimethylbenzene and tetramethylbenzene; alkoxybenzenes such as anisole; and blends thereof. On the other hand, PVK is soluble in solvents such as 1,2-dichloroethane.

The described treatment has been found to improve efficiency and lifetime of PLEDs. Without wishing to be bound by any theory, the following factors may contribute to these observed increases:

The first layer may act as a hole transporting, electron blocking and/or exciton blocking layer when located between the anode and the second layer.

Where a PEDT/PSS layer is used, the insoluble hole transporting layer may prevent ingress of protons from the acidic PSS material into the second layer. This may apply in particular where the polymer comprises basic units such as amines of formulae 1-6 or Het groups described above, such as pyridyl, that are capable of accepting protons.

The thinness of the insoluble layer, which is achievable in particular when rinsing of the hole transporting layer is employed to remove remaining soluble material, may block electrons from entering the PEDT/PSS hole injection layer and/or ITO anode layer without any detriment to device performance that may result from a thicker layer, such as higher drive voltage.

EXAMPLES

General Procedure

The invention is exemplified here using the polymer "F8-TFB", illustrated below and disclosed in WO 99/54385, as the hole transporting layer.

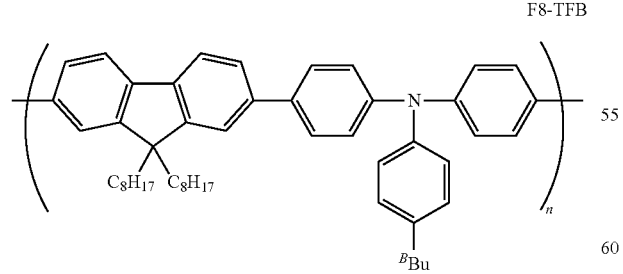

F8-TFB

The general procedure follows the steps outlined below:
1) Depositing PEDT/PSS (available from H C Starck of Leverkusen, Germany as Baytron P®) onto indium tin oxide supported on a glass substrate (available from Applied Films, Colorado, USA) by spin coating.
2) Depositing a hole transporting layer by spin coating F8-TFB from a xylene solution having a concentration of 2% w/v.
3) Heating the hole transporting layer in an inert (nitrogen) environment.
4) Optionally spin-rinsing the substrate in xylene to remove any remaining soluble F8-TFB.
5) Depositing the electroluminescent layer by spin-coating from xylene solution.
6) Depositing over the electroluminescent layer a cathode comprising a first layer of lithium fluoride (4 nm), a second layer calcium (10 nm) and a capping layer of aluminum (>200 nm) as described in WO 00/48258.
7) Encapsulation of the device using an airtight metal enclosure available from Saes Getters SpA.

Parameters within this general process may be varied. In particular: the concentration of the hole transporting material may be up to around 3% w/v. Alternatively, it may be as low as 0.5% w/v to provide a particularly thin film; the optional heating step may last for any length of time up to around 2 hours; and the optional heating step may be at any temperature up to around 220° C., but preferably above the glass transition temperature of the deposited polymer. As will be apparent to the skilled person, first and/or second polymers, and other device components such as PEDT/PSS, will be subject to thermal degradation if the heating temperature is excessive, and the heating temperature should be selected accordingly.

Example 1

The general procedure above was followed using an electroluminescent layer comprising:

a host polymer having the composition 70% 9,9-dioctylfluorene-2,7-diyl, 10% 9,9-diphenylfluorene-2,7-diyl, 10% "TFB" repeat unit and 10% "PFB" repeat unit as disclosed in WO 02/92723 (TFB and PFB repeat units are illustrated below). The polymer was prepared by Suzuki polymerization as disclosed in, for example, WO 00/53656.

the red phosphorescent dopant platinum octaethylporphine (PtOEP) as disclosed in Nature (London), 1998, 395, 151.

The host:dopant ratio was 98.8:1.2.

The hole transporting layer was subjected to heat treatment at 130° C. for 10 minutes prior to deposition of the electroluminescent layer.

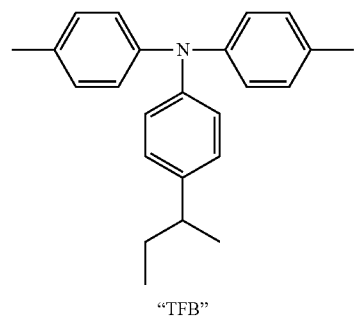

"TFB"

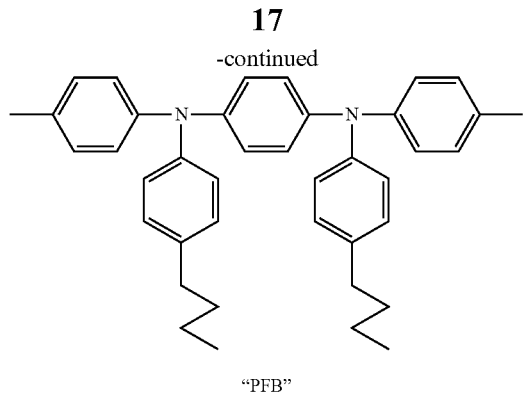

"PFB"

Comparative Example 1

For the purpose of comparison, a device was made in accordance with Example 1 except that the hole transporting layer (i.e. steps 24 of the above general method) was omitted.

Example 2

A device was made in accordance with Example 1 except that the host:dopant ratio was 98.0:2.0.

Comparative Example 2

For the purpose of comparison, a device was made in accordance with Example 2 except that the hole transporting layer (i.e. steps 24 of the above general method) was omitted.

Example 3

A device was made in accordance with Example 1 except that the electroluminescent layer consisted of host material CBP and the green electroluminescent dendrimer dopant ED1, disclosed in WO 02/066552 and illustrated below, deposited by spin-coating from a chloroform solution having a CBP:ED1 ratio of 8:2.

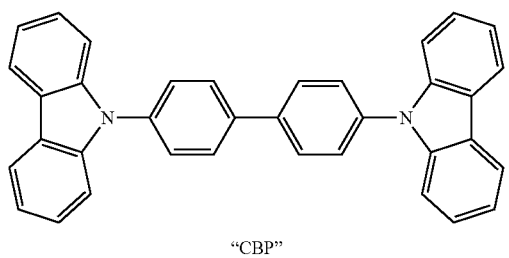

"CBP"

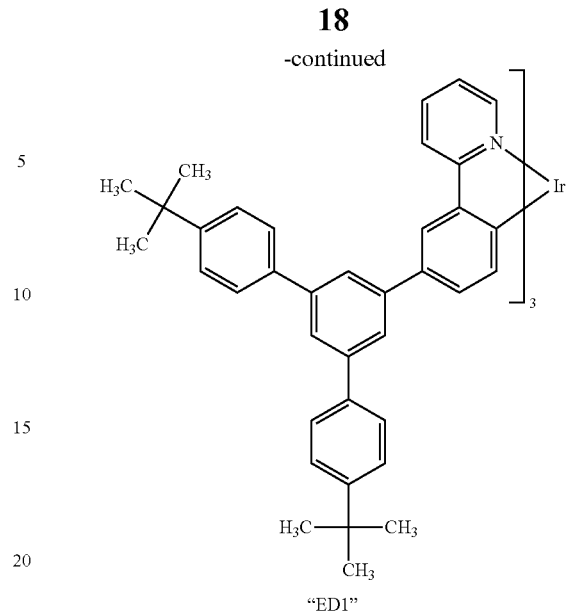

"ED1"

Comparative Example 3

For the purpose of comparison, a device was made in accordance with Example 3 except that the hole transporting layer (i.e. steps 2-4 of the above general method) was omitted.

Table 1 below shows a comparison of quantum efficiency and lifetime of devices according to the invention and the comparative examples. As can be seen, there is a very significant improvement in efficiency upon inclusion of the hole transporting layer for Examples 1 and 2. Furthermore, lifetime is improved for both the red PtOEP emitter (Example 1) and the green ED1 emitter (Example 3).

In contrast to Examples 1 and 2, efficiency falls for Example 3 (ED1 dopant) relative to its Comparative Example. Without wishing to be bound by any theory, this is believed to be due to quenching of luminance by hole transporting layer 4 in Example 3 as a result of the bandgap of this material being insufficiently wide as compared to the bandgap of the electroluminescent material. It is believed that the increase in lifetime of Example 3 may be achieved whilst retaining or exceeding the efficiency of the Comparative Example by use of an appropriate wider bandgap material (i.e. an exciton blocking layer as hereinbefore described).

TABLE 1

| Device | Lifetime* | Quantum efficiency at 100 cd/m$^2$ | Maximum quantum efficiency |
|---|---|---|---|
| Comparative Example 1 | 3852[1] | 1.88 | 2.26 |
| Example 1 | 9592[2] | 3.25 | 3.52 |
| Comparative Example 2 | | 1.92 | 2.22 |
| Example 2 | | 2.98 | 3.11 |
| Comparative Example 3 | 670 | 6.4 | 6.4 |
| Example 3 | 1014 | 3.0 | 4.2 |

*"Lifetime" in Table 1 is the time taken for luminance of the device to halve when driven at a constant current from a starting luminance of 100 cd/m$^2$ in the case of Example 1 and 400 cd/m$^2$ in the case of Example 3.
[1]Average of 2 devices measured Although the invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. A method of forming an organic light emitting diode comprising, in sequence, a first electrode for injection of charge carriers of a first type; a first charge transporting layer comprising a first charge transporting material for transporting charge carriers of the first type; an electroluminescent layer adjacent to the charge transporting layer; and a second electrode for injection of charge carriers of a second type, the method comprising the steps of:

forming the first charge transporting layer by a solution processing method from a composition comprising a solvent and the first charge transporting material being soluble in the solvent, wherein the first charge transporting material is a small molecule, polymer or dendrimer comprising an optionally substituted triarylamine unit, wherein the first charge transporting material is a hole-transporting material;

rendering the first charge transporting layer insoluble in the solvent by heat treatment at a temperature above the glass transition temperature of the hole-transporting material; and forming the electroluminescent layer from a composition comprising a solvent, a phosphorescent material and a small molecule host material.

2. A method according to claim 1, wherein a charge injection layer comprising a conductive organic material for injection of charge carriers of the first type is provided between the first electrode and the first charge transporting layer.

3. A method according to claim 1, wherein the first charge transporting material has a higher triplet energy level than the phosphorescent material.

4. A method according to claim 2, wherein the conductive organic material comprises poly (ethylenedioxythiophene).

5. A method according to claim 1 wherein the first charge transporting material comprises a cross-linkable material and the rendering comprises subjecting the first charge transporting layer to heat or electromagnetic radiation in order to cross-link the first charge transporting material.

6. A method according to claim 1 wherein the first charge transporting material is a polymer.

7. A method according to claim 6 wherein the polymer comprises an optionally substituted triarylamine repeat unit.

8. A method according to claim 7 wherein the triarylamine repeat unit comprises an optionally substituted repeat unit of formula (I):

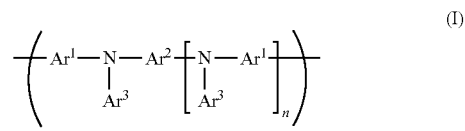

wherein each $Ar^1$, $Ar^2$ and $Ar^3$ is the same or different and independently represents optionally substituted aryl; and n is 0 or 1.

9. A method according to claim 6 wherein the polymer comprises a repeat unit selected from optionally substituted fluorene, indenofluorene, spirofluorene and phenylene.

10. A method according to claim 1 wherein the phosphorescent material is a metal complex.

11. An organic light emitting diode obtainable by the method according to claim 1.

* * * * *